United States Patent
Wang et al.

(10) Patent No.: US 9,324,764 B2
(45) Date of Patent: Apr. 26, 2016

(54) ARRAY SUBSTRATE AND DISPLAY DEVICE

(75) Inventors: Benlian Wang, Beijing (CN); Zhiqin Zhang, Beijing (CN); Feng Bai, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 704 days.

(21) Appl. No.: 13/806,198

(22) PCT Filed: Aug. 29, 2012

(86) PCT No.: PCT/CN2012/080713
§ 371 (c)(1),
(2), (4) Date: Dec. 21, 2012

(87) PCT Pub. No.: WO2013/029540
PCT Pub. Date: Mar. 7, 2013

(65) Prior Publication Data
US 2013/0141660 A1    Jun. 6, 2013

(30) Foreign Application Priority Data
Aug. 29, 2011 (CN) .......................... 2011 1 0251655

(51) Int. Cl.
*G02F 1/1333* (2006.01)
*G02F 1/136* (2006.01)
(Continued)

(52) U.S. Cl.
CPC ........ *H01L 27/156* (2013.01); *G02F 1/136286* (2013.01); *G09G 3/3648* (2013.01);
(Continued)

(58) Field of Classification Search
CPC ............ G02F 1/1368; G02F 1/136213; G02F 1/1333; G02F 1/133305; G02F 1/133351; G02F 2001/133354; G02F 2001/133302; H01L 27/1214
USPC ..................................... 349/158, 43
See application file for complete search history.

(56) References Cited

U.S. PATENT DOCUMENTS

2009/0262054 A1* 10/2009 Hsu ...................... G09G 3/3648
345/87
2011/0128261 A1* 6/2011 Hung ................ G02F 1/136286
345/205

FOREIGN PATENT DOCUMENTS

CN         101487962 A       7/2009
CN         101527306 A       9/2009
(Continued)

OTHER PUBLICATIONS

2$^{nd}$ Chinese Office Action dated May 14, 2013; Appln. No. 201110251655.2.
(Continued)

*Primary Examiner* — Mike Qi
(74) *Attorney, Agent, or Firm* — Ladas & Parry LLP

(57) ABSTRACT

Embodiments of the present invention relate to an array substrate and a display device comprising the array substrate. According to an embodiment of the invention, there is provided an array substrate which comprises: a terminal region; and an active pixel region, the active pixel region comprising: a plurality of pixel units; a plurality of gate lines; a plurality of data lines; and a plurality of gate leading wires, wherein two columns of the plurality of pixel units are provided between two adjacent data lines among the plurality of data lines, each of the plurality of gate leading wires is disposed between the two columns of the plurality of pixel units, and each of the plurality of gate lines is connected to respective one of the plurality of gate leading wires.

14 Claims, 2 Drawing Sheets

(51) Int. Cl.
*H01L 27/15* (2006.01)
*G02F 1/1362* (2006.01)
*G09G 3/36* (2006.01)
*G02F 1/1345* (2006.01)

(52) U.S. Cl.
CPC .............. *G02F2001/13456* (2013.01); *G02F 2001/13606* (2013.01); *G02F 2001/136231* (2013.01); *G02F 2201/40* (2013.01); *G02F 2201/506* (2013.01); *G09G 2300/0426* (2013.01); *G09G 2310/0281* (2013.01)

(56) References Cited

FOREIGN PATENT DOCUMENTS

| CN | 101561596 A | 10/2009 |
|----|-------------|---------|
| CN | 101582422 A | 11/2009 |
| CN | 101587266 A | 11/2009 |
| CN | 102081246 A | 6/2011 |
| CN | 102103293 A | 6/2011 |
| JP | 2010-072363 A | 4/2010 |

OTHER PUBLICATIONS

Chinese Re-Examination Decision Appln. No. 201110251655,2; Dated Jan. 13, 2015.
International Search Report dated Dec. 13, 2012; PCT/CN2012/080713.
First Chinese Office Action, dated Nov. 29, 2012; Appln. No. 2011102516552.
International Preliminary Report on Patentability dated Mar. 4, 2014; PCT/CN2012/080713.

* cited by examiner

ARRAY SUBSTRATE AND DISPLAY DEVICE

BACKGROUND

Embodiments of the present invention relate to an array substrate and a display device comprising the array substrate.

Thin Film Transistor Liquid Crystal Displays (TFT-LCDs) have the advantages of small volume, low power consumption, irradiation-free, etc., and thus have prevailed in the current flat panel display market.

Generally, a display area on a substrate of a TFT-LCD contains a plurality of pixel units, each of the plurality of pixel units is a rectangular region formed by crossing of two gate lines and two data lines, and a TFT and a pixel electrode are provided within each of the plurality of pixel units. For each TFT, its gate electrode and source/drain electrode are collected to a gate line and a data line, respectively, all the gate lines are collected to a gate driver, and all the data lines are connected a source/drain driver, so as to provide driving signals for the gate electrode and the source/drain electrode of the TFT.

Because the cost of a source/drain driving integrated circuit (IC) chip is higher than the cost of a gate driving IC chip, a conventional wiring technology (in which the number of driving IC chips corresponds to the number of leading wires) makes manufacturing cost of the LCD higher. In order to overcome this defect, a Dual Gate technology emerges, namely, an effect of reducing the number of the data lines (corresponding to the number of the source driving IC chips) by half is achieved by doubling the number of gate leading wires (corresponding to the number of the gate driving IC chips). Thereby, the data lines can be reduced, so as to decrease the manufacturing cost of the LCD. As shown in FIG. 1, on an array substrate in which the Dual Gate technology is used, there are included first gate lines G1, G3 and G5 parallel to each other and second gate lines G2, G4 and G6 parallel to each other, and data lines are insulated from and cross perpendicularly over the first gate lines and the second gate lines. Two columns of pixel units are contained between two adjacent data lines, and TFTs for the two columns of pixel units are connected to one of the first gate lines and one of the second gate lines, respectively. For example, a TFT 12A for a pixel unit in which a pixel electrode 10A is located is connected to the first gate line G1, a TFT 12B for a pixel unit in which a pixel electrode 10B is located is connected to the second gate line G2. The first gate lines G1, G3 and G5 are extracted from the left side of the substrate, and the second gate lines G2, G4 and G6 are extracted from the right side of the substrate, and they are connected to a corresponding gate driver A and a corresponding gate driver B, respectively. The data lines are extracted from a side adjacent to the two gate drivers and are connected to a source driver. The gate drivers and the source driver are controlled by a timing controller (T-con) to transmit a signal to a corresponding pixel electrode.

For a conventional single-gate-line pixel structure, the coupling capacitance between a data line and a pixel electrode is inversely proportional to the distance between the data line and the pixel electrode, and if the aligning precision is very high and distances from the pixel unit to adjacent two data lines thereof are equal to one another at ideal conditions, coupling capacitances for each pixel unit are equal to one another. In a practical process, the aligning deviation occurs between a pixel electrode layer and a data line layer, the coupling capacitance may increase or reduce with the reduction or increase of the distance. Nevertheless, for each of the pixel units, because there are two data lines on both sides thereof, when the aligning deviation occurs, the coupling capacitance between the pixel unit and one of the two data lines increases and the coupling capacitance between the pixel unit and the other reduces accordingly, the positive addition and the negative addition may offset to each other and so their effects may offset after the two coupling capacitances are added. And, the deviation is the same for each of the pixel units. However, regarding a Dual-Gate pixel structure, as shown in FIG. 2(a), for each of the pixel electrodes, the coupling capacitance generates between only one of the data lines and the pixel electrode, for example, what corresponds to a pixel electrode A is Cpd1, and what corresponds to a pixel electrode B is Cpd2. Distance between the pixel electrode A and its adjacent data line is d1, and distance between the pixel electrode B and its adjacent data line is d2. As shown in FIG. 2(b), in a practical process, when the aligning deviation occurs between the pixel electrode layer and the data line layer, the deviation results in such a case that d1 is reduced and Cpd1 is increased and d2 is increased and Cpd2 is reduced. Therefore, impacts on two adjacent pixel electrodes which are exerted by data lines are imbalanced. Thereby, the display effect of the LCD is affected.

Similarly, in such a case that the data lines and the pixel electrodes are not arranged alternately, impacts on two adjacent pixel electrodes which are exerted by the data lines are imbalanced. Thus, the aligning deviation between the pixel electrode layer and the data line layer in the practical process may exert the negative influence on the display effect of the LCD.

On a conventional array substrate of a TFT-LCD, a side leading wire manner is used for the gate electrode, the gate leading wires are provided at two opposed sides of an active pixel region of the TFT-LCD, and thus scan signals which are outputted from an gate driver are transmitted to scan lines in the pixel region to thereby control each of the pixel units. However, each of the gate leading wires occupies a certain area, and hence an adequate peripheral wiring region (fan-out) needs to be reserved previously so as to arrange all of the gate leading wires. The size of the fan-out region determines the size of a frame of the substrate of the TFT-LCD, and the size of the fan-out region is determined by the number of the gate leading wires, that is, the resolution of the TFT-LCD determines the size of the frame. Here, the gate leading wire refers to a wire for connecting a gate line to the gate driver.

In the prior art, in order to decrease the size of the frame of the TFT-LCD, a peripheral double-layered wiring (dual fan-out) design is used, in which two kinds of metal are used for wirings in different layers in the fan-out, and a Gate-layer metal and a Source-Drain-layer (SD-layer) metal are usually selected for wirings in a Gate-layer and a SD-layer, respectively. By this way, the number of leading wire for each layer is reduced by half, and the area occupied by the wiring region is decreased accordingly, whereby the size of the frame can be reduced. As the resolution of the LCD becomes larger and larger, the size of the frame will also become larger and larger. Even if the size of the frame can be decreased by using the Dual fan-out design, the resolution of the LCD still restricts the size of the frame to thereby hinder the development of a large-scale, thin-frame LCD.

SUMMARY

An object of an embodiment of the invention is to provide an array substrate with a narrow frame and a display device comprising the array substrate, which is capable of reducing cost of data lines and enhancing the display effect.

For addressing the above issue, an embodiment of the present invention provides an array substrate, which comprises a terminal region and an active pixel region, the active pixel region comprising a plurality of pixel units, a plurality of gate lines, a plurality of data lines and a plurality of gate leading wires, wherein two columns of the plurality of pixel units are provided between two adjacent data lines among the plurality of data lines, each of the plurality of gate leading wires is disposed between the two columns of the plurality of pixel units, and each of the plurality of gate lines is connected to respective one of the plurality of gate leading wires.

According to an embodiment of the invention, there is further provided a display device, comprising an array substrate which includes a terminal region and an active pixel region, a color filter substrate which is combined with the array substrate and a liquid crystal layer which is interposed between the array substrate and the color filter substrate, the active pixel region comprising a plurality of pixel units, a plurality of gate lines, a plurality of data lines, and a plurality of gate leading wires, wherein two columns of the plurality of pixel units are provided between two adjacent data lines among the plurality of data lines, each of the plurality of gate leading wires is disposed between the two columns of the plurality of pixel units, and each of the plurality of gate lines is connected to respective one of the plurality of gate leading wires.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Array substrates and display devices proposed by the invention will be described in detail in combination with accompanied drawings and embodiments as follows.

Embodiment 1

In an embodiment of the invention, in such a case that data lines and pixel units are not arranged alternately, gate leading wires are provided in an active pixel region, so as to balance imbalanced impacts of the data lines on pixels and meanwhile narrow a frame.

Hereinafter, an array substrate using a Dual Gate technology will be given as an example to explain the technical solutions according to an embodiment of the invention, but the embodiment of the invention is not limited to this. For the array substrate using the Dual Gate technology, a gate leading wire (GIA line) is disposed between two columns of pixel units between which no data line is provided, so as to balance imbalanced impacts of data lines on pixels and meanwhile narrow a frame.

More specifically, the data lines and the pixel units of an array substrate using the conventional Dual Gate technology are not arranged alternately, the number of gate lines is twice as many as the row number of the pixel units, two gate lines are disposed between every two rows of the pixel units and two columns of the pixel units are disposed between two adjacent data lines. According to an embodiment of the invention, a gate leading wire is disposed between two columns of pixel units between which no data line is provided, and imbalanced impacts of the data lines on the pixels in the Dual Gate structure can be avoided and a frame can be narrowed.

Figure 1:
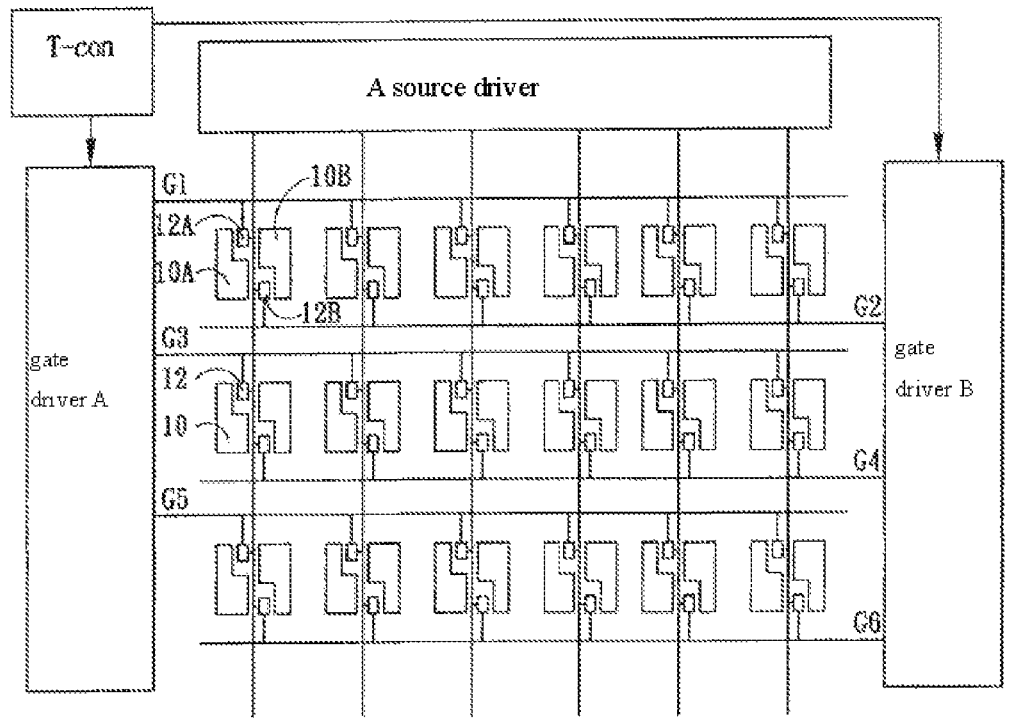
FIG. 1 is a schematic view illustrating an array substrate for which a conventional Dual Gate technology is used.
Figure 2:
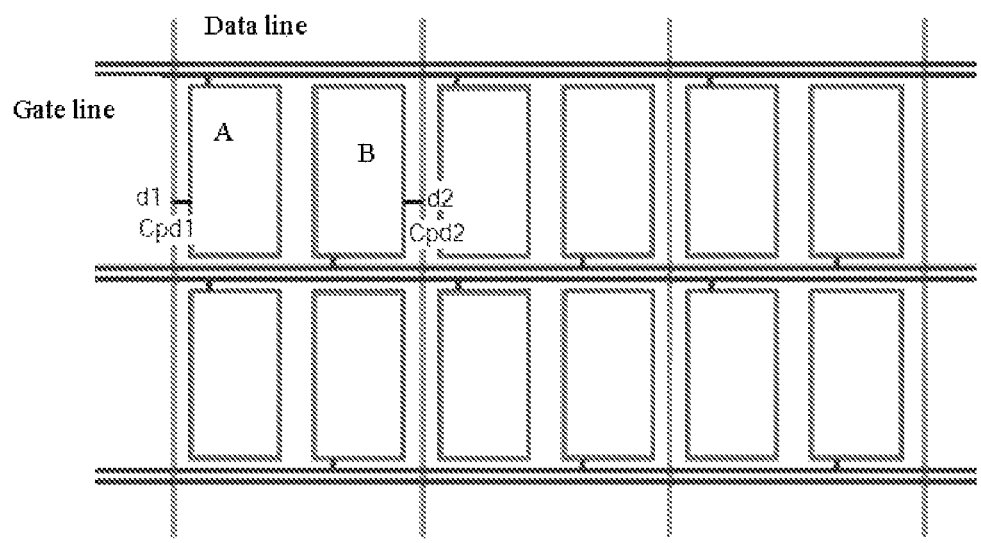
FIG. 2(a) and FIG. 2(b) are schematic views illustrating an ideal pixel structure of an array substrate and a pixel structure thereof when the aligning deviation occurs, respectively, wherein the array substrate is formed by using the conventional Dual Gate technology.
Figure 2:
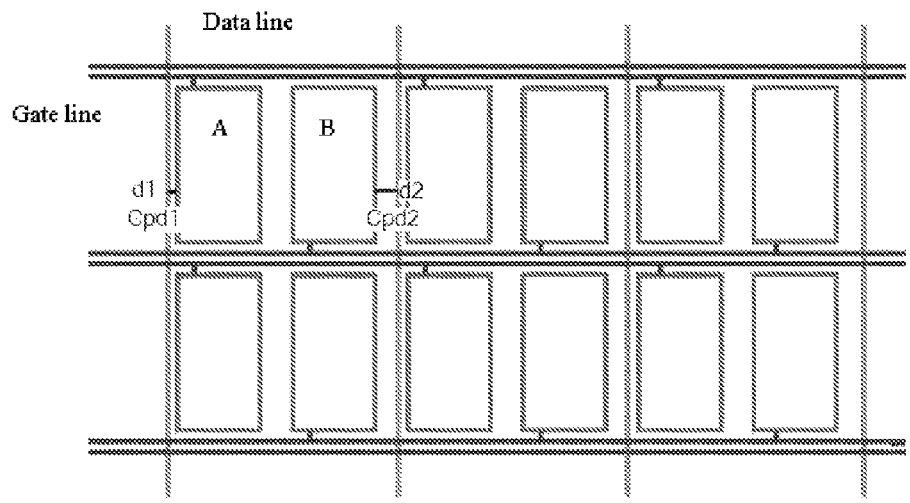

In detail, the detailed explanations can be made in combination with FIG. 2(a) and FIG. 2(b). As shown in FIG. 2(a) and FIG. 2(b), coupling capacitances between one data line and its adjacent pixel electrodes are respectively Cpd1 and Cpd2, what corresponds to the pixel electrode A is Cpd1 and what corresponds to the pixel electrode B is Cpd2. Distance between the pixel electrode A and its adjacent data line is d1, and distance between the pixel electrode B and its adjacent data line is d2. When a gate leading wire is disposed between A and B, if the aligning deviation between a pixel electrode layer and a data line layer causes an increased Cpd1 and a reduced Cpd2 in a practical process, the aligning deviation results in such a case that a coupling capacitance between the gate leading wire and the pixel electrode A decreases and a coupling capacitance between the gate leading wire and the pixel electrode B increases because the gate leading wire is disposed between A and B. Therefore, synthetically, impacts of coupling capacitances on two adjacent pixel electrodes are balanced. Thus, the display effect of the LCD is enhanced.

Likewise, a dummy line (pseudo line) is disposed between A and B, and/or the gate leading wire is disposed at other positions of the active pixel region, an effect that imbalanced impacts of the data lines on the pixels in the Dual Gate structure is eliminated and the frame is narrowed can also be achieved. As such, not only imbalanced impacts of the data lines on the pixels in the Dual Gate structure can be eliminated, but also an interactive interference caused by parallel arrangement of the gate leading wire and the data lines can be avoided, so as to enhance the display effect.

Figure 3:
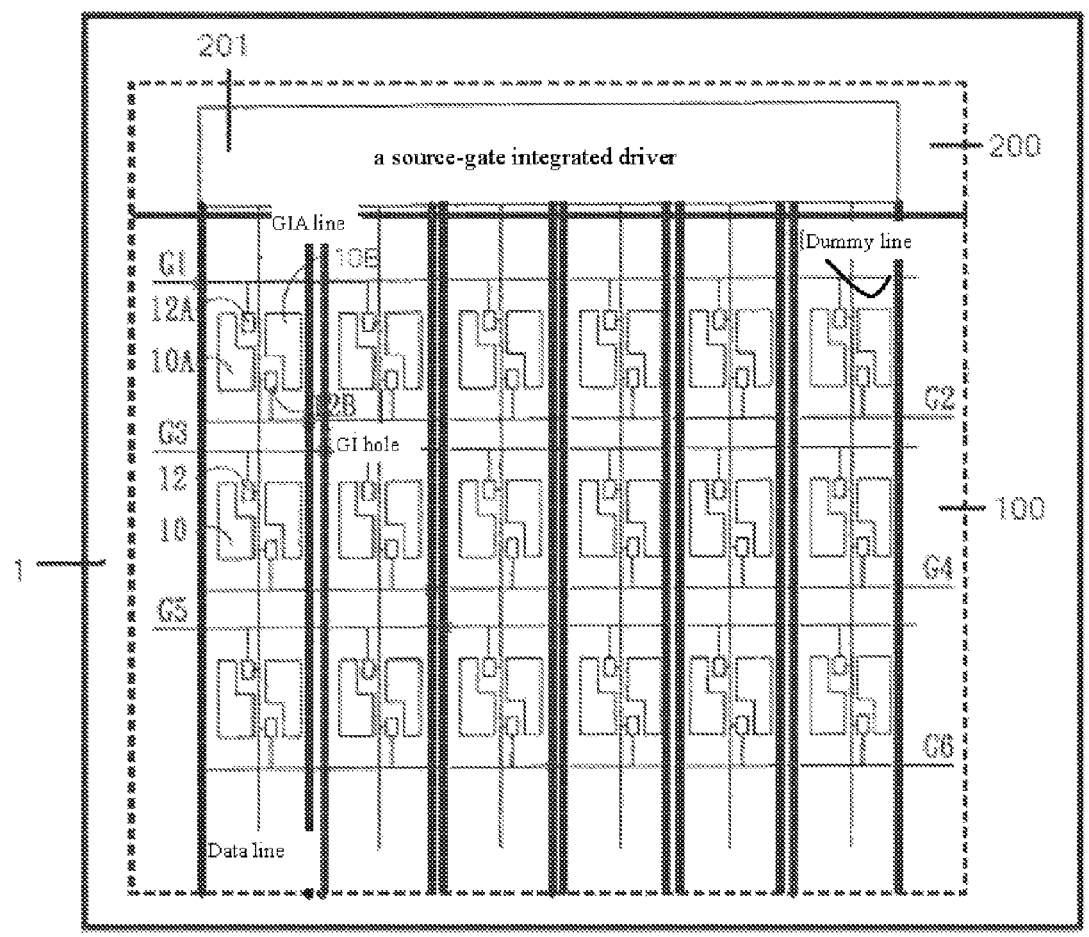
FIG. 3 is a schematic view illustrating an array substrate according to an embodiment of the invention.

As shown in FIG. 3, a super-narrow-frame array substrate 1 according to an embodiment of the invention comprises: an active pixel region 100 being a valid display region and a terminal region 200 which is a non-display region. The active pixel region 100 is a rectangular region, and the terminal region 200 may be located at one side or two opposed sides of the active region 100. Thus, an effect of narrowing the frame can be realized. Pixel units, gate lines, data lines and gate leading wires are included within the active pixel region 100. The gate lines comprises a plurality of first gate lines parallel to each other, as denoted by G1, G3 and G5 in the figure, and a plurality of second gate lines parallel to each other, as denoted by G2, G4 and G6 in the figure, wherein the first gate lines and the second gate lines are provided alternately. As shown in the figure, from top to bottom, there are a first gate line G1, a second gate line G2, a first gate line G3, a second gate line G4, a first gate line G5 and a second gate line G6 in sequence. A plurality of data lines parallel to each other are insulated from and cross perpendicularly over the first gate lines and the second gate lines; and between two adjacent data lines, there are contained two columns of pixel units which are connected to the first gate lines and the second gate lines, respectively. The gate leading wires are connected to the corresponding gate lines.

In the embodiment shown in FIG. 3, a gate leading wire is disposed between two columns of the pixel units and respective one and/or two of the gate leading wire may be disposed between every two columns of the pixel units, but it is not limited thereto. Here, a gate leading wire refers to a wire for connecting the gate line to a gate driver.

In other words, if two columns of the pixel units having one data line therebetween and the data line are taken as one group, one or two of the gate leading wires are disposed between every two adjacent groups, and in each of the groups, gate electrodes of TFTs for the two columns of the pixel units are connected to the first gate line and the second gate line, respectively. As shown in FIG. 3, between the column on which a pixel unit 10A is located and the column on which a pixel unit 10B is located, there is provided one data line, and a gate electrode of a TFT 12A is connected to the first gate line G1, and a gate electrode of a TFT 12B is connected to a second gate line G2.

Each of the gate leading wires (GIA lines) can be electrically connected to one gate line through a via hole (GI hole). The number of the gate leading wires (GIA lines) and the number of the gate lines are the same. However, due to different setting modes of the gate leading wires (there are one gate leading wire or two gate leading wires provided between two groups), it is possible that neither the data line nor the gate leading wire is disposed between some two adjacent pixel units after the gate leading wires are arranged completely, and thus, imbalanced impacts of the data lines on the pixels will still be present. In order to avoid the impact, a Dummy line may be provided. Preferably, in a region where the gate leading wire is not provided, the Dummy line is provided in the same manner as the gate leading wire, namely, only the arrangement mode of the Dummy line is the same as that of the gate leading wire. The Dummy line is not electrically connected to the gate line actually, and it may be provided in a floating way or a voltage of ½V may also be applied to it. Capacitive coupling effects on the pixel electrodes can be balanced by providing the Dummy line, to thereby enhance the display quality.

In all embodiments of the invention, in the case that the data lines and the pixel units are not arranged alternately, imbalanced impacts of the data lines on the pixels can be balanced and meanwhile the frame is narrowed by using the technical solutions of the invention. The gate leading wire (GIA line) and the Dummy line can be disposed between two columns of pixel units between which no data line is provided in any combination way, as long as the gate leading wire and/or the Dummy line are provided between every two columns of pixel units. Preferably, the gate leading wire and the Dummy line are parallel to the data line.

The gate leading wire and the data leading wire can be connected to a gate driver and a source driver provided within the terminal region 200, respectively. In the embodiment, in order to further decrease a size of the substrate, the gate driver and the source driver may be integrated as a source-gate integrated driver 201, and the gate leading wire and the data leading wire are connected to it.

During a process manufacturing a display device according to an embodiment of the invention, the gate leading wire and the data line can be formed in the same layer with the same material in the same photolithography or mask process and the gate leading wire is connected to the gate line through via holes, and thus, the number of the process can be decreased and the number of the mask is reduced. Alternatively, the gate leading wire and the data line can be formed in the different layers, or can be fainted in the different process, and thus the gate leading wire and the data line can be superposed in a direction perpendicular to the substrate, and the aperture ratio can be effectively improved. Their details will be omitted here, and they should not be construed as limiting of technical solutions of the invention.

[The Technical Effect]

With the array substrate according to an embodiment of the invention, the gate leading wires are disposed in the active pixel region, imbalanced impact of the data lines on the pixels is balanced and meanwhile the frame is narrowed.

Embodiment 2

According to an embodiment of the invention, a display device comprising the above array substrate is provided.

Specifically, the display device comprises: the array substrate, as mentioned above; a color filter substrate, which is disposed opposite the above array substrate, and color filters and a black matrix are formed thereon; and a liquid crystal layer, which is interposed between the array substrate and the color filter substrate.

Examples of the display device may include: a liquid crystal panel, a liquid crystal television, a liquid crystal display device, a digital photo frame, an electronic paper, a cell phone, etc.

Example 1

In the example, a QVGA display will be given as an example, and the resolution of the display is 320×240 (RGB), namely, there are 320 gate lines and 240×3=720 data lines formed on the substrate. According to the method of an embodiment of the invention, by using the Dual Gate technology, the number of the gate lines is doubled to be 640, and correspondingly, the number of the gate leading wires is also 640 so that one gate leading wire corresponds to one gate line, and the number of the data lines is reduced by half to be 360. As can be seen from the pixel arrangement in FIG. 3, each of the gate leading wires is electrically connected to respective one gate line through a GI hole, and for respective two columns of pixel units which are located between every two data lines, respective two gate leading wires are provided therebetween, that is, every two gate leading wires and one of the data lines are arranged alternately, and then the gate leading wires have already been arranged completely after the 320th data line is arranged. In order to make sure that impacts of the data lines on the pixels are balanced, at each of locations where the gate leading wires should be provided between every two of the following 40 data lines, respective two Dummy lines (without a GI hole) are put in to be arranged alternately with the data lines. The Dummy lines are made to be arranged alternately with the data lines, or the gate leading wires are made to be arranged alternately with the data lines, namely, the gate leading wires or the Dummy lines beside the data line are distributed symmetrically so as to make sure that impacts of metal lines on the pixels are balanced favorably, thereby facilitating stability of display and improvement of display quality.

Another alternative arrangement manner is: respective two gate leading wires are provided between two columns of pixel units of each of any 280 groups which are located between any two data lines, and respective one gate leading wire is provided between two columns of pixel units of each of remaining 80 groups, and then arrangement can be exactly completed without the Dummy lines. Dummy lines do not need to be provided, and the aperture ratio of the pixel unit can be improved, so as to enhance the utilization ratio of light. Alternatively, it is possible that respective two gate leading wires are provided between two columns of pixel units of each of 280 groups which are located between any two data lines, and respective one gate leading wire and respective one Dummy line are provided between two columns of pixel units of each of remaining 80 groups, so as to facilitate a balance between impacts of the data lines on the pixels.

Example 2

In the example, a QCIF display will be given as an example, and the resolution of the display is 176×144 (RGB), namely, there are 176 gate lines and 144×3=432 data lines included on the substrate. According to the method provided by an embodiment of the invention, by using the Dual Gate technology, the number of the gate lines is doubled to be 352, the number of gate leading wires is also 352 accordingly so that one gate leading wire corresponds to one gate line, and the number of the data lines is reduced by half to be 216. Respective one gate leading wire is arranged between two columns of pixel units of each of 80 groups which are located between any two data lines, and respective two gate leading wires are provided between two columns of pixel units of each of remaining 136 groups, and then arrangement of the 352 leading wires can be completed. Each of the gate leading wires is electrically connected to respective one gate line through a GI hole without the provision of the Dummy line. Dummy lines do not need to be provided, and the aperture ratio of a pixel unit can be improved, so as to enhance utilization ratio of light.

Example 3

In the example, a HVGA display will be given as an example, and the resolution of the display is 480×320 (RGB), namely, there are 480 gate lines and 320×3=960 data lines included on a substrate. According to the method provided by an embodiment of the invention, by using the Dual Gate technology, the number of the gate lines is doubled to be 960, the number of gate leading wires is also 960 accordingly so that one gate leading wire corresponds to one gate line, and the number of the data lines is reduced by half to be 480. Each of the gate leading wires is electrically connected to respective one gate line through a GI hole, respective two gate leading wires are provided between every two columns of pixel units, every two gate leading wires are arranged alternately with respective one of the data lines, and then the arrangement can be completed in correspondence to all of the data lines. The gate leading wires have already been arranged completely after the 480th data line is arranged. It is unnecessary to introduce a Dummy line, and thus the aperture ratio of a pixel unit can be improved, to thereby enhance utilization ratio of light.

In all of the foregoing embodiments, between respective two columns of pixel units which are located between every two data lines, respective one, two, three, four, or more gate leading wires may be provided according to requirements, or the gate leading wires may not be provided. Between every two columns of pixel units, respective one, two, three, four, or more Dummy lines may be provided according to requirements, or Dummy lines may not be provided, and this facilitates freedom of design. The gate leading wires are distributed symmetrically on two sides of a data line, or Dummy lines are disposed symmetrically according to requirements, and impacts of the data lines on the pixels can be balanced favorably, so as to facilitate stability of display and improvement of display quality.

[The Technical Effect]

With the display device comprising the array substrate according to an embodiment of the invention, the gate leading wire is disposed in the active pixel region, and it is possible that imbalanced impacts of the data lines on the pixels are balanced and meanwhile a frame is narrowed.

The forgoing embodiments are merely used to explain the invention, rather than set a limit on the invention. Various changes and variances may further be made by those ordinarily skilled in the related technical field without departing from the spirit and scope of the invention, and therefore, all equivalent technical solutions also come within the scope of the invention. The patent protection scope of the invention shall be defined by the following claims.

What is claimed is:

1. An array substrate, comprising:
   a terminal region; and
   an active pixel region, the active pixel region comprising:
   a plurality of pixel units;
   a plurality of gate lines;
   a plurality of data lines; and
   a plurality of gate leading wires,
   wherein two columns of the plurality of pixel units are provided between two adjacent data lines among the plurality of data lines, each of the plurality of gate leading wires is disposed between the two columns of the plurality of pixel units, and each of the plurality of gate lines is connected to respective one of the plurality of gate leading wires,
   wherein two of the plurality of gate leading wires are provided between the two columns of the plurality of pixel units,
   wherein the array substrate further comprises a dummy line, the dummy line is disposed between the two columns of the pixel units and is a leading wire not being connected to every gate line of the plurality of gate lines, the number of the dummy line disposed between the two columns of the pixel units is two,
   the dummy line is floated.

2. The array substrate claimed as claim 1, wherein the number of the plurality of gate lines is twice as many as the row number of the plurality of pixel units, and two of the gate lines are provided between two rows of pixel units among the plurality of pixel units.

3. The array substrate claimed as claim 1, wherein the terminal region is located at one side or two opposed sides of the active pixel region, within the terminal region, there are provided a source driver and a gate driver, the plurality of data lines each are connected to the source driver, and the plurality of gate leading wires each are connected to the gate driver.

4. The array substrate claimed as claim 1, wherein the terminal region is located at one side or two opposed sides of the active pixel region, within the terminal region, there is provided a source-gate integrated driver, the plurality of data lines and the plurality of gate leading wires each are connected to the source-gate integrated driver.

5. The array substrate claimed as claim 1, wherein the plurality of gate leading wires and the plurality of data lines are located in the same layer, the plurality of gate leading wires are parallel to the plurality of data lines, each of the plurality of gate leading wires is electrically connected to respective one of the plurality of gate lines through a via hole.

6. The array substrate claimed as claim 1, wherein the number of the plurality of gate lines is 640, the number of the plurality of data lines is 360, the number of the plurality of gate leading wires is 640, and respective two of the gate leading wires are disposed between the two columns of the pixel units of each of any 320 groups, each group having two columns of the pixel units.

7. The array substrate claimed as claim 6, wherein respective two of the dummy lines are disposed between the two columns of the pixel units of each of remaining 40 groups.

8. The array substrate claimed as claim 1, wherein the plurality of gate leading wires and the plurality of data lines are located in the different layers.

9. A display device, comprising:
an array substrate, including:
a terminal region; and
an active pixel region, the active pixel region comprising:
a plurality of pixel units;
a plurality of gate lines;
a plurality of data lines; and
a plurality of gate leading wires;
a color filter substrate, disposed opposite the array substrate; and
a liquid crystal layer, interposed between the array substrate and the color filter substrate,
wherein two columns of the plurality of pixel units are provided between two adjacent data lines among the plurality of data lines, each of the plurality of gate leading wires is disposed between the two columns of the plurality of pixel units, and each of the plurality of gate lines is connected to respective one of the plurality of gate leading wires,
wherein the array substrate further comprises a dummy line, the dummy line is disposed between the two columns of the pixel units and is a leading wire not being connected to every gate line of the plurality of gate lines, the number of dummy line disposed between the two columns of the pixel units is two,
wherein two of the plurality of gate leading wires are provided between the two columns of the plurality of pixel units, the dummy line is floated.

10. The display device claimed as claim 9, wherein number of the plurality of gate lines is twice as many as the row number of the plurality of pixel units, and two of the gate lines are provided between two rows of pixel units among the plurality of pixel units.

11. The display device claimed as claim 9, wherein the terminal region is located at one side or two opposed sides of the active pixel region, within the terminal region, there are provided a source driver and a gate driver, the plurality of data lines each are connected to the source driver, and the plurality of gate leading wires each are connected to the gate driver.

12. The display device claimed as claim 9, wherein the terminal region is located at one side or two opposed sides of the active pixel region, within the terminal region, there is provided a source-gate integrated driver, the plurality of data lines and the plurality of gate leading wires each are connected to the source-gate integrated driver.

13. The display device claimed as claim 9, wherein the plurality of gate leading wires and the plurality of data lines are located in the same layer, the plurality of gate leading wires are parallel to the plurality of data lines, each of the plurality of gate leading wires is electrically connected to respective one of the plurality of gate lines through a via hole.

14. The display device claimed as claim 9, wherein the plurality of gate leading wires and the plurality of data lines are located in the different layers.

* * * * *